United States Patent [19]
Matsuo et al.

[11] Patent Number: 5,200,637
[45] Date of Patent: Apr. 6, 1993

[54] MOS TRANSISTOR AND DIFFERENTIAL AMPLIFIER CIRCUIT WITH LOW OFFSET

[75] Inventors: Kenji Matsuo; Yasukazu Noine; Kazuhiko Kasai, all of Yokohama, Japan

[73] Assignee: Kabushiki Kaisha Toshiba, Kawasaki, Japan

[21] Appl. No.: 658,461

[22] Filed: Feb. 22, 1991

Related U.S. Application Data

[63] Continuation of Ser. No. 449,765, Dec. 13, 1989, abandoned.

[30] Foreign Application Priority Data

Dec. 15, 1988 [JP] Japan .................................. 63-317104

[51] Int. Cl.$^5$ ........................................... H01L 27/01
[52] U.S. Cl. ................................... 257/368; 257/401; 257/409
[58] Field of Search ............... 357/23.1, 23.4, 45, 357/41, 53, 23.11, 23.8, 23.3

[56] References Cited

U.S. PATENT DOCUMENTS

| | | | |
|---|---|---|---|
| 4,015,278 | 3/1977 | Fukuta | 357/23.14 |
| 4,575,743 | 3/1986 | Hashimoto | 357/23.1 |
| 4,636,825 | 1/1987 | Baynes | 357/23.14 |
| 4,638,259 | 1/1987 | Saari | 330/253 |
| 4,737,837 | 4/1988 | Lee | 357/23.1 |
| 4,766,333 | 8/1988 | Mobley | 330/253 |
| 4,767,722 | 8/1988 | Blanchard | 357/23.4 |
| 4,785,343 | 11/1988 | Nezu | 357/23.1 |
| 4,799,096 | 1/1989 | Koeppe | 357/23.14 |
| 4,799,097 | 1/1989 | Szluk et al. | 357/41 |
| 4,821,084 | 4/1989 | Kinugasa et al. | 357/23.1 |
| 4,833,513 | 5/1989 | Sasaki | 357/23.4 |
| 4,901,134 | 2/1990 | Misawa et al. | 357/23.9 |
| 4,914,400 | 4/1990 | Kobayashi et al. | 330/253 |
| 4,918,510 | 4/1990 | Pfiester | 357/23.11 |
| 4,951,175 | 8/1990 | Kurosawa et al. | 357/23.6 |
| 5,006,815 | 4/1991 | Klumperink et al. | 330/253 |
| 5,016,069 | 5/1991 | Bergemont | 357/53 |

FOREIGN PATENT DOCUMENTS

| | | | |
|---|---|---|---|
| 2852049 | 6/1979 | Fed. Rep. of Germany | 357/41 |
| 47-18281 | 9/1972 | Japan | 357/53 |
| 54-00387 | 1/1979 | Japan | 357/53 |
| 56-43769 | 4/1981 | Japan | 357/41 |
| 56-69865 | 6/1981 | Japan . | |
| 56-091472 | 7/1981 | Japan | 357/23.9 |
| 57-089253 | 6/1982 | Japan | 357/23.9 |
| 59-05665 | 1/1984 | Japan | 357/45 |
| 60-80252 | 5/1985 | Japan | 357/53 |
| 60-226120 | 11/1985 | Japan | 357/23.9 |
| 63-204655 | 8/1988 | Japan | 357/23.1 |
| 2139419 | 5/1983 | United Kingdom | 357/23.9 |

Primary Examiner—Andrew J. James
Assistant Examiner—Courtney A. Bowers
Attorney, Agent, or Firm—Finnegan, Henderson, Farabow, Garrett & Dunner

[57] ABSTRACT

A MOS transistor includes a gate electrode layer formed on an insulation layer which is formed on an element formation region defined by a field insulation layer formed on a P-type semiconductor substrate. The gate electrode layer has first and second openings formed therein. Further, N-type impurity diffusion regions acting as the drain and source of the MOS transistor are formed in those portions of the surface area of the semiconductor substrate which lie under the first and second openings.

14 Claims, 5 Drawing Sheets

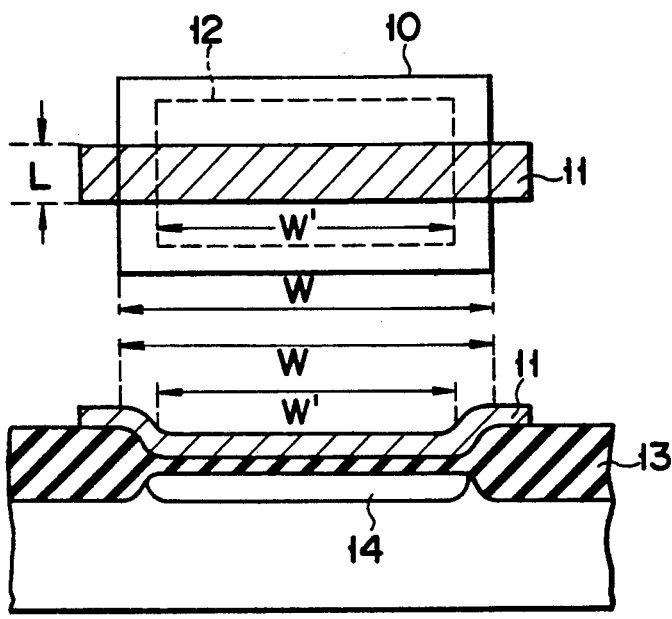
FIG. 1A (PRIOR ART)
FIG. 1B (PRIOR ART)
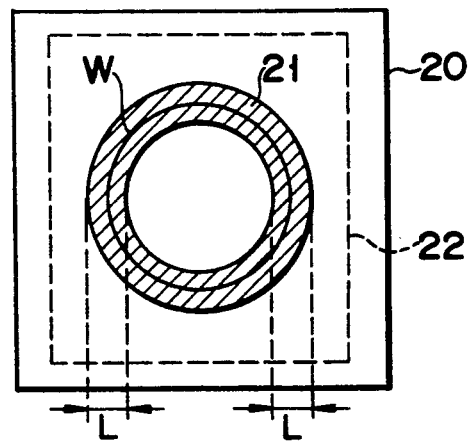
FIG. 2A (PRIOR ART)
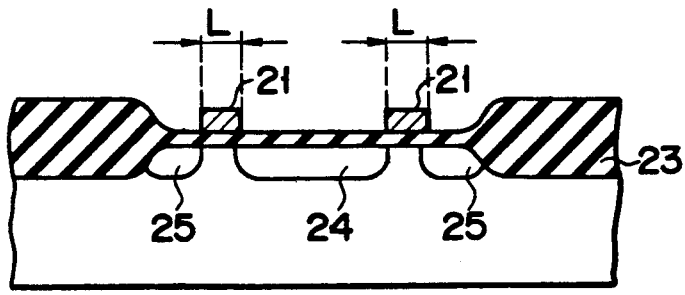
FIG. 2B (PRIOR ART)

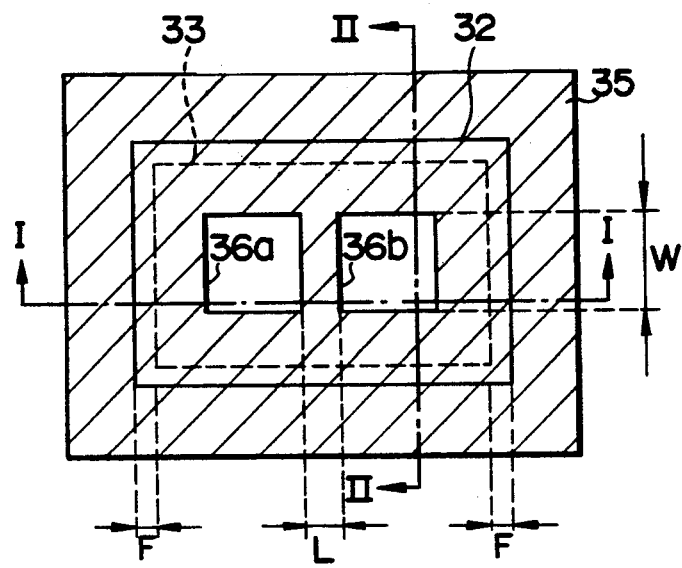
F I G. 3A
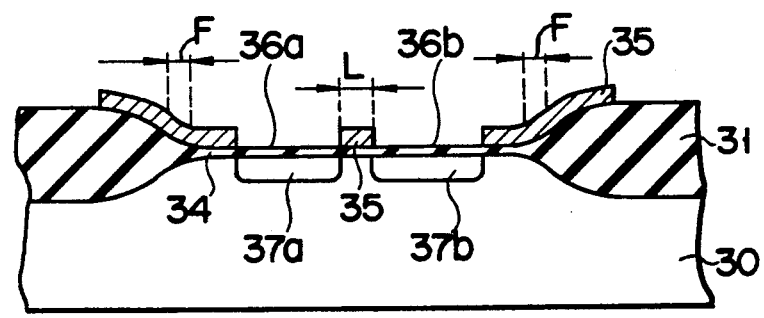
F I G. 3B
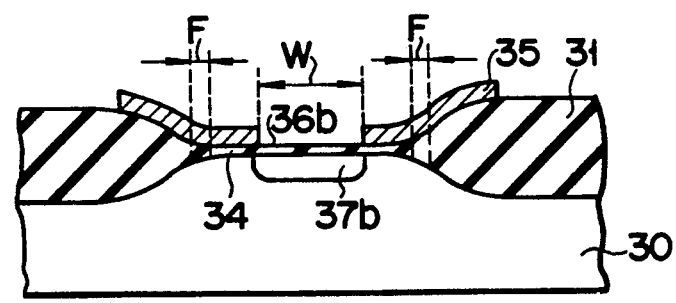
F I G. 3C

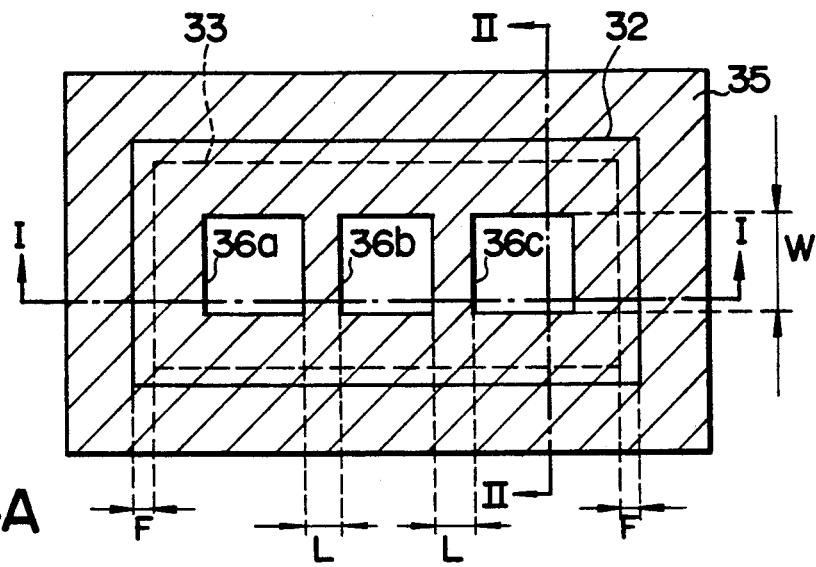
F I G. 4A
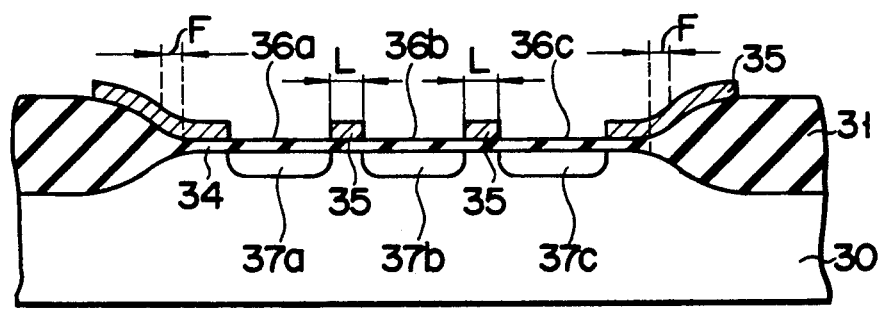
F I G. 4B
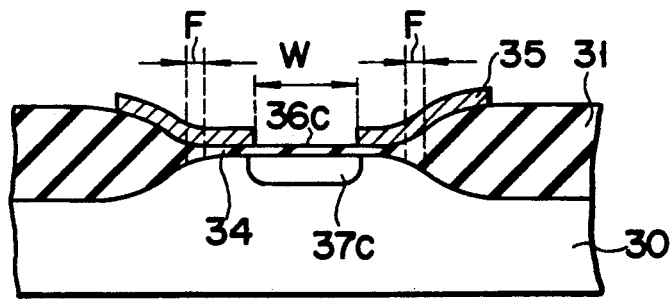
F I G. 4C

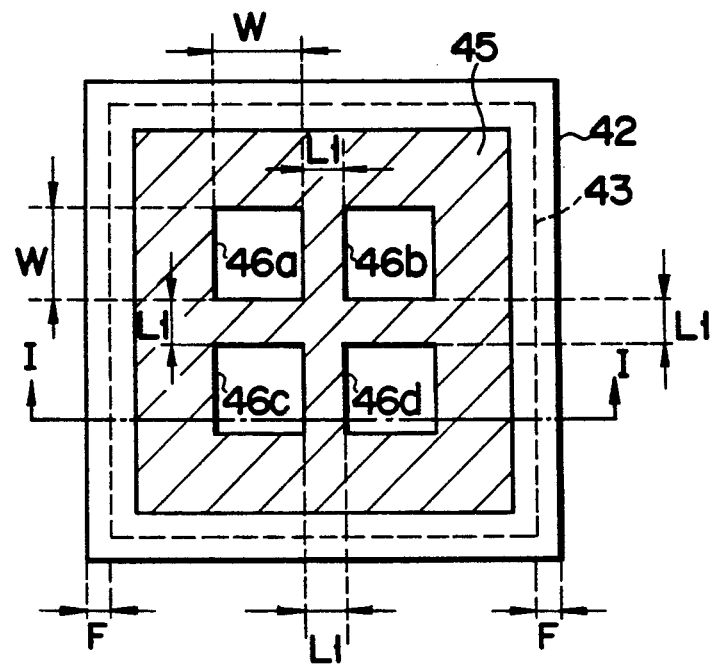
F I G. 5A
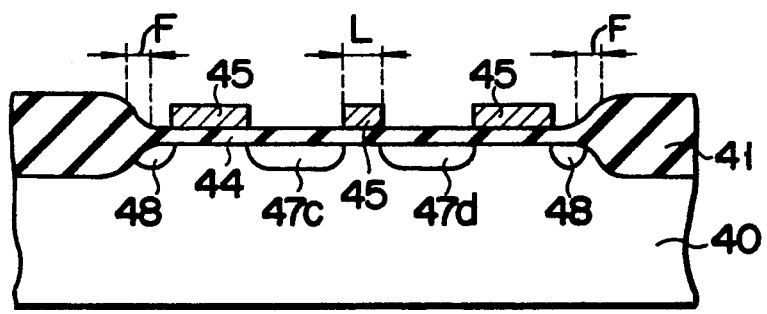
F I G. 5B

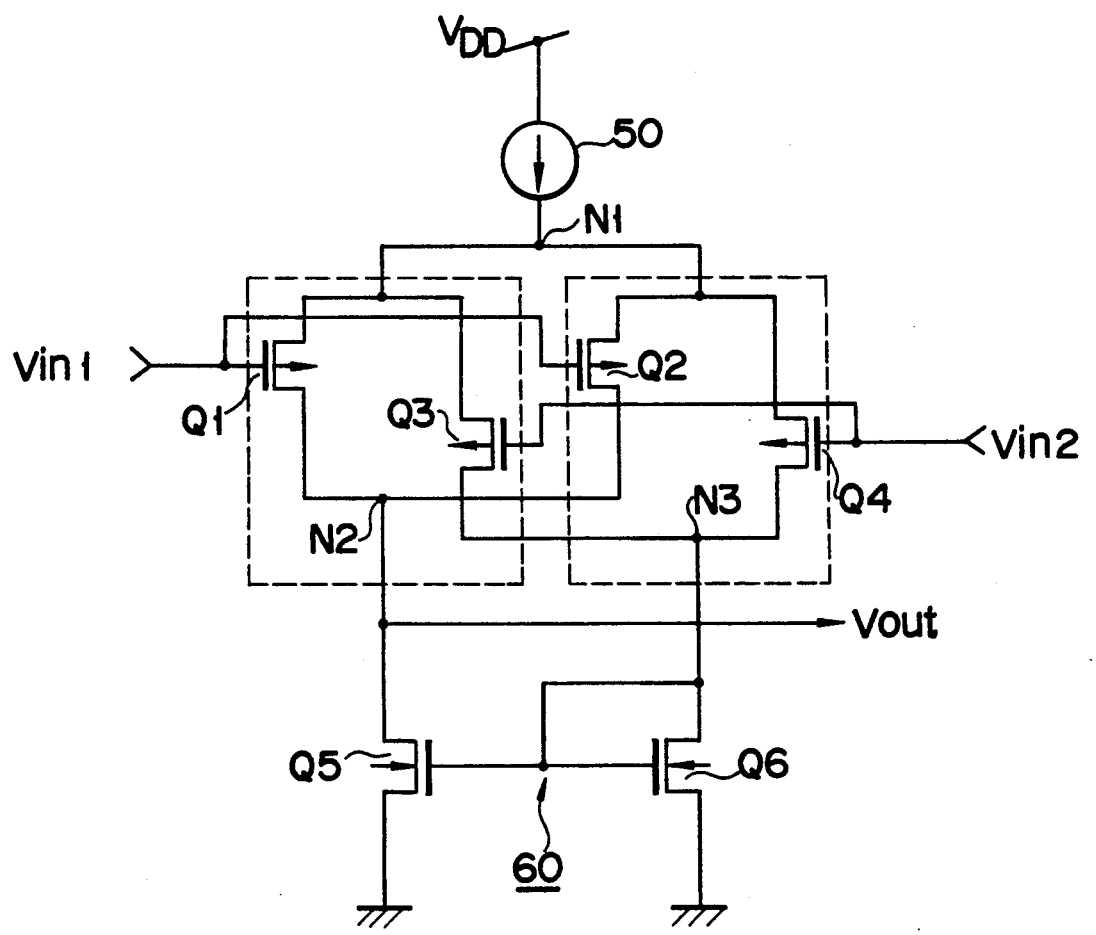
F I G. 6

MOS TRANSISTOR AND DIFFERENTIAL AMPLIFIER CIRCUIT WITH LOW OFFSET

This application is a continuation of application Ser. No. 07/449,765, filed Dec. 13, 1989, now abandoned.

BACKGROUND OF THE INVENTION

1. Field of the Invention

This invention relates to a MOS transistor and a differential amplifier circuit using the same, and more particularly to the construction of a MOS transistor for lowering the offset voltage of a differential amplifier circuit, and a differential amplifier circuit of low offset voltage using the same.

2. Description of the Related Art

FIGS. 1A and 1B show a typical pattern shape and cross section of a conventional MOS transistor. Referring to FIGS. 1A and 1B, numeral 10 denotes an element region designed for forming a MOS transistor, and numeral 12 denotes an actually formed physical element region (SDG). As can be clearly seen in FIG. 1A, the dimensions of the actually formed element region 12 are smaller than the design dimensions, because of the bird's beak of the field insulation layer 13 formed by the LOCOS method. Since the channel length L of the MOS transistor is defined by the width of the gate electrode layer 11, it is not affected by a reduction in the dimensions of the element region; however, the channel width W thereof is defined by the width of a diffusion layer 14 used as a source or drain region and is therefore reduced to W', as shown in FIGS. 1A and 1B, due to the dimensions of the element region being smaller than the design dimensions.

Not only does a reduction in the channel width occur in every MOS transistor formed on a semiconductor chip by means of the conventional method, but the degree of difference between the design channel width W and the actual channel width W' may vary from one MOS transistor to another, since the dimensions of the bird's beak formed in the field insulation layer 13 are not constant and vary from one portion to another of the chip on which the field insulation layer 13 is formed. Consequently, when a plurality of MOS transistors of the same construction as shown in FIGS. 1A and 1B are formed on the same chip, the current characteristics may well vary from transistor to transistor.

In the case of a differential amplifier circuit, it is generally preferable to set the current characteristics of the differential input stage transistors equal to each other in order to suppress the offset voltage to a minimum. However, when the differential amplifier circuit is formed by use of MOS transistors of the construction as described before, the differential input stage transistors are likely to be formed having different channel widths, which makes it difficult to reduce the offset voltage.

A ring-shaped MOS transistor as shown in FIGS. 2A and 2B has been developed as a type the channel width of which is not affected by a reduction in the dimensions of the element region. FIG. 2A shows the pattern shape of this MOS transistor and FIG. 2B shows a cross section thereof. In the above MOS transistor, a diffusion region 24 formed inside a ring-shaped gate electrode layer 21 serves as a drain region, and a diffusion region 25 formed outside layer 21 serves as a source region. Numeral 20 denotes an element region designed for forming a MOS transistor and numeral 22 denotes an actually formed physical element region. As can be clearly seen in FIG. 2A, the dimensions of the actually formed element region 22 are smaller than the design dimensions, because of the bird's beak of the field insulation layer 13.

However, in the above MOS transistor, the channel length L is defined by the width of the annular portion of the ring-shaped gate electrode layer 21 and the channel width W is determined by the circumference of a circle formed halfway between the inner circumference of the ring-shaped gate electrode layer 21 and the outer circumference thereof, and is not influenced by the dimensions of the element region. Consequently, the transistor characteristic is not affected by any reduction in the dimensions of the element region.

The gate electrode layer 21 of the above transistor is formed independently in the element region and does not extend to the outside thereof. For this reason, it is necessary for a contact to be formed which directly connects the gate electrode layer 21 and a wiring on layer 21, in which case the dimensions of the contact area are determined by the width of the annular portion of layer 21.

Therefore, in order to obtain a sufficiently large contact area, it becomes necessary to increase the width of the annular portion of the gate electrode layer 21. However, any increase in the width of the annular portion causes a corresponding increase in the dimensions of the element of the MOS transistor, thereby preventing any increase in the integration density.

SUMMARY OF THE INVENTION

An object of this invention is to provide a MOS transistor having a construction by means of which a desired characteristic can be obtained without being affected by a reduction in the dimensions of the element region by the bird's beak, and which is conducive to miniaturization.

Another object of this invention is to provide a differential amplifier circuit of low offset voltage, by use of the above MOS transistor.

According to a first aspect of this invention, there is provided a MOS transistor comprising a semiconductor substrate of a first conductivity type; a field insulation layer formed on the semiconductor substrate; a gate electrode layer having first and second openings and formed on an insulation layer which is formed on an element region defined by the insulation layer; and source and drain regions of a second conductivity type formed in those portions of the surface area of the semiconductor substrate which lie under the first and second openings.

According to a second aspect of this invention, there is provided a differential amplifier circuit using MOS transistors having the same construction as that of the above MOS transistor as differential input transistors.

In the above MOS transistor, the channel length is determined by the distance between the first and second openings and the channel width is determined by the dimension of each of the first and second openings. Therefore, it is possible to form a MOS transistor having a desired characteristic without being affected by reduction in the dimensions of the element region by the bird's beak. Since the desired current pair property or the desired similarity of the current characteristics of the differential input transistors can be set by using the above MOS transistors as the differential input transistors, the offset voltage of the differential amplifier circuit can be prevented.

BRIEF DESCRIPTION OF THE DRAWINGS

FIG. 1A is a plan view showing the plane pattern of a typical conventional MOS transistor;

FIG. 1B is a cross sectional view showing the cross section of the MOS transistor shown in FIG. 1A;

FIG. 2A is a plan view showing the plane pattern of another conventional MOS transistor;

FIG. 2B is a cross sectional view showing the cross section of the MOS transistor shown in FIG. 2A;

FIG. 3A is a plan view showing the plane pattern of a MOS transistor according to a first embodiment of this invention;

FIG. 3B is a cross sectional view showing the cross section of the MOS transistor taken along the line I—I of FIG. 3A;

FIG. 3C is a cross sectional view showing the cross section of the MOS transistor taken along the line II—II of FIG. 3A;

FIG. 4A is a plan view showing the plane pattern of a MOS transistor according to a second embodiment of this invention;

FIG. 4B is a cross sectional view showing the cross section of the MOS transistor taken along the line I—I of FIG. 4A;

FIG. 4C is a cross sectional view showing the cross section of the MOS transistor taken along the line II—II of FIG. 4A;

FIG. 5A is a plan view showing the plane pattern of a MOS transistor according to a third embodiment of this invention;

FIG. 5B is a cross sectional view showing the cross section of the MOS transistor taken along the line I—I of FIG. 5A; and FIG. 6 is a differential amplifier circuit using the MOS transistor according to the first to third embodiments.

DETAILED DESCRIPTION OF THE PREFERRED EMBODIMENTS

An embodiment of this invention will now be described, with reference to FIGS. 3A to 3C. FIG. 3A shows the pattern shape of the MO transistor according to this embodiment, FIG. 3B is a cross sectional view showing the cross section taken along the line I—I of FIG. 3A, and FIG. 3C is a cross sectional view showing the cross section taken along the line II—II of FIG. 3A.

As shown in FIGS. 3A to 3C, a field insulation layer 31 is formed by the LOCOS method on a P-type silicon substrate 30 and the dimension of an element region 33 defined by the field insulation layer 31 is reduced by the dimension F in comparison with the designed element region 32 because of the presence of the bird's beak of the field insulation layer 31. Further, a silicon oxide film 34 acting as a gate insulation layer is formed on the P-type silicon substrate 30 and a polysilicon layer 35 acting as a gate electrode is formed by deposition on the silicon oxide film 34.

As shown in FIGS. 3A and 3B, the polysilicon layer 35 is formed to extend outside the designed element region 32 and is formed with two rectangular openings 36a and 36b. The openings 36a and 36b are of the same dimension. N-type diffusion layers 37a and 37b acting as source and drain are formed in those portions of the surface area of the substrate 30 which lie under the openings 36a and 36b.

In the MOS transistor with the above construction, the channel length L is determined by the distance between the openings 36a and 36b and the channel width W is determined by the dimensions of the openings 36a and 36b. Therefore, the channel length L and the channel width W can be set to the designed values without receiving any influence by reduction in the dimension of the element region due to the presence of the bird's beak. As a result, a desired transistor characteristic can be obtained. Moreover, since the gate electrode layer 35 can be formed to extend outwardly of the designed element region 32, a contact for connecting the gate electrode layer 35 to a gate wiring can be formed outside the element region 32. As a result, the contact can be formed with a sufficiently large area irrespective of the dimension of the element region 32, thus making it possible to form the element region 32 in a fine pattern.

Next, a MOS transistor according to a second embodiment of this invention will be described, with reference to FIGS. 4A to 4C.

FIG. 4A shows the pattern shape of a MOS transistor according to the second embodiment of this invention, FIG. 4B shows the cross section thereof taken along the line I—I of FIG. 4A and FIG. 4C shows the cross section thereof taken along the line II—II of FIG. 4A.

The MOS transistor of the second embodiment is similar to the MOS transistor of the first embodiment, except in the following respects. Specifically, in the MOS transistor of the second embodiment, three rectangular openings 36a, 36b and 36c are formed in a polysilicon layer 35 acting as a gate electrode. The openings 36a, 36b and 36c are of the same dimension. N-type diffusion layers 37a, 37b and 37c are formed in those portions of the surface area of the substrate 30 which lie under the openings 36a, 36b and 36c. The N-type diffusion layer 37b serves as a source and the diffusion layers 37a and 37c serve as a drain.

In the MOS transistor of the above construction, the channel length is determined by the distance L between the openings 36a and 36b and the channel width is set to the dimension 2W which is twice the dimension of each of the openings 36a and 36b.

Like the first embodiment, in the second embodiment, the channel length and the channel width can be determined by the openings 36a, 36b and 36c formed in the polysilicon layer 35 acting as the gate electrode. Therefore, a desired characteristic can be obtained irrespective of reduction in the dimension of the element region due to the presence of the bird's beak.

Next, the construction of a MOS transistor according to a third embodiment will be explained, with reference to FIGS. 5A and 5B.

FIG. 5A shows the pattern shape of the MOS transistor and FIG. 5B is a cross sectional view showing the cross section taken along the line I—I of FIG. 5A.

As shown in FIGS. 5A and 5B, a field insulation layer 41 is formed by the LOCOS method on a P-type silicon substrate 40 and the dimension of an element region 43 defined by the field insulation layer 41 is reduced by the dimension F in comparison with the designed element region 42 because of the presence of the bird's beak of the field insulation layer 41. Further, a silicon oxide film 44 acting as a gate insulation layer is formed on the P-type silicon substrate 40 and a polysilicon layer 45 acting as a gate electrode is formed by deposition on the silicon oxide film 44.

As shown in FIGS. 5A and 5B, the polysilicon layer 45 is formed inside the designed element region 42 and is formed with four rectangular openings 46a, 46b, 46c and 46d. The openings 46a to 46d are of the same dimension and one side length of each opening is W.

N-type diffusion layers acting as source or drain are formed in those portions of the surface area of the substrate 40 which lie under the openings 46a to 46d. For clarity, only N-type diffusion layers 47c and 47d corresponding to the openings 46c and 46d are shown in FIG. 5B.

In the MOS transistor with the above construction, the channel length is determined by the distance L1 between the openings 46a, 46b and the openings 46c, 46d in a case where the diffusion layers lying under the openings 46a and 46b are used as the source and the diffusion layers lying under the openings 46c and 46d are used as the drain, and in this case, the channel width is 2W. On the other hand, in a case where the diffusion layers lying under the openings 46a and 46d are used as the source and the diffusion layers lying under the openings 46b and 46c are used as the drain, the channel length becomes L1, and in this case, the channel width becomes 4W.

Also, in the third embodiment, the channel length and the channel width can be determined by the openings formed in the polysilicon layer 45 acting as the gate electrode. Therefore, a desired characteristic can be obtained irrespective of reduction in the dimension of the element region due to the presence of the bird's beak. Further, in a case where the polysilicon layer 45 is formed inside the element region 43, an N-type diffusion layer 48 is formed in that portion of the surface area of the substrate 49 which lies under the outer peripheral portion of the polysilicon layer 45 as shown in FIG. 5B. However, no voltage is applied to the diffusion layer 48, giving no influence on the transistor characteristic.

In the third embodiment, the openings 46a to 46d are formed with the same dimension, but they can be formed with different dimensions.

FIG. 6 shows an example of a differential amplifier circuit using the MOS transistor according to the first to third embodiments.

In the differential amplifier circuit, a constant current source 50 is connected between a power source VDD terminal and a node N1. P-channel MOS transistors Q1 and Q2 whose gates are connected to receive an input signal Vin1 are connected in parallel between the node N1 and a node N2. Likewise, P-channel MOS transistors Q3 and Q4 whose gates are connected to receive an input signal Vin2 are connected in parallel between the node N1 and a node N3. The nodes N2 and N3 are grounded via a current mirror circuit 60 constituted by N-channel MOS transistors Q5 and Q6. A voltage at the node N2 is derived as a output signal Vout.

In the above differential amplifier circuit, the transistors Q1 to Q4 used as the differential input transistors are formed with the construction as described in the first to third embodiments. Therefore, the dimensions, or the channel lengths and the channel widths of the transistors Q1 to Q4 can be set to the same value irrespective of reduction in the dimension of the element region due to the presence of the bird's beak. Further, since different input signals are supplied to the transistors Q1 and Q3 which are formed adjacent to each other and different input signals are supplied to the transistors Q2 and Q4 which are formed adjacent to each other, a difference between the threshold voltages of the differential transistors relating to the input signal Vin1 and the threshold voltages of the differential transistors relating to the input signal Vin2 can be reduced. As a result, a desired current pair property of the differential input transistors can be set, thus making it possible to prevent occurrence of the offset voltage.

Further, MOS transistors of the same construction as described in the first to third embodiments can be used as the N-channel MOS transistors constituting the current mirror circuit 60.

The above MOS transistor construction can be applied to a P-channel transistor and an N-channel transistor.

As described above, according to this invention, a MOS transistor can be obtained which is suitable for miniaturization and which can attain a desired characteristic without receiving influence by reduction in the dimension of the element region due to the presence of the bird's beak. Further, a differential amplifier circuit in which occurrence of an offset voltage can be prevented can be obtained by using the above MOS transistors.

What is claimed is:

1. A MOS transistor comprising:
   a semiconductor substrate of a first conductivity type;
   a LOCOS type field insulation layer and a gate insulation layer, formed on said semiconductor substrate, said gate insulation layer having a first region defining an element forming region and said LOCOS type field insulation layer having a second region surrounding the element forming region;
   a gate electrode layer formed on said LOCOS type field insulation layer, and covering said element forming region and a portion of the second region surrounding the element forming region, and including at least first and second openings formed above the element forming region, all of said first and second openings being formed inside and apart from a boundary between the element forming region and the second region by a first predetermined distance; and
   first and second impurity diffusion regions of a second conductivity type, respectively acting as drain and source regions, and formed in said semiconductor substrate in contact with the gate insulation layer and under said first and second openings in said gate electrode layer;
   wherein the channel length of the MOS transistor is defined by a second predetermined distance between the first and second openings in the gate electrode layer, and the channel width of the MOS transistor is defined by the dimensions of the first and second openings in the gate electrode layer.

2. A MOS transistor according to claim 1, wherein said first and second openings are rectangularly shaped.

3. A MOS transistor according to claim 1, wherein said gate electrode layer further includes a third opening formed above the element forming region, and said MOS transistor further includes a third impurity diffusion region of the second conductivity type, formed in said semiconductor substrate in contact with the gate insulation layer and under said third opening in said gate electrode layer, to act as a source or drain region.

4. A MOS transistor according to claim 3, wherein said first, second and third openings are rectangularly shaped.

5. A MOS transistor according to claim 1, wherein said gate electrode layer further includes third and fourth openings formed above the element forming region, and said MOS transistor further includes third and fourth impurity diffusion regions of the second conductivity type formed in said semiconductor substrate in contact with the gate insulation layer and under said third and fourth openings, respectively, in said gate electrode layer, to respectively act as drain and source regions.

6. A MOS transistor according to claim 5, wherein said first, second, third and fourth openings are rectangularly shaped.

7. A MOS transistor according to claim 5, wherein said first and second openings in said gate electrode layer are arranged in parallel with said third and fourth openings in said gate electrode layer.

8. A differential amplifier circuit comprising:
a pair of first and second differential MOS transistors which are arranged adjacent to each other in a first area of a semiconductor substrate of a first conductivity type, and having gates supplied with first and second input signals, respectively; and
a pair of third and fourth differential MOS transistors which are arranged adjacent to each other in a second area of said semiconductor substrate and having gates supplied with said first and second input signals, respectively;
wherein said first and third differential MOS transistors are connected in parallel, and said second and fourth differential MOS transistors are connected in parallel;
each of said first through fourth differential MOS transistors comprising:
a LOCOS type field insulation layer and a gate insulation layer formed on said semiconductor substrate, said gate insulation layer having a first region defining an element forming region and said LOCOS type field insulation layer having a second region surrounding the element forming region;
a gate electrode layer formed on said LOCOS type field insulation layer covering said element forming region and a portion of the second region surrounding the element forming region, and including first and second openings formed above the element forming region without overlapping the second region; and first and second impurity diffusion regions of a second conductivity type, respectively acting as drain and source regions, and formed in said semiconductor substrate in contact with the gate insulation layer and under said first and second openings in said gate electrode layer;
wherein the channel length of each of the first and second differential MOS transistors is defined by the distance between the first and second openings in the gate electrode layer, and the channel width of each of the first and second differential MOS transistors is defined by the dimensions of the first and second openings in the gate electrode layer.

9. A differential amplifier circuit according to claim 8, wherein said first and second openings are rectangularly shaped.

10. A differential amplifier circuit according to claim 8, wherein said gate electrode layer further includes a third opening formed above the element forming region and said first and second differential MOS transistors further include a third impurity diffusion region of the second conductivity type, formed in said semiconductor substrate in contact with the gate insulation layer and under said third opening in each gate electrode layer, to act as a source or drain region.

11. A differential amplifier circuit according to claim 10, wherein said first, second and third openings are rectangularly shaped.

12. A differential amplifier circuit according to claim 8, wherein said gate electrode layer further includes third and fourth openings formed above the element forming region, and said first and second differential MOS transistors further include third and fourth impurity diffusion regions of the second conductivity type formed in said semiconductor substrate in contact with said gate insulation layer and under said third and fourth openings, respectively, in said gate electrode layer, to respectively act as drain and source regions.

13. A differential amplifier circuit according to claim 12, wherein said first, second, third and fourth openings are rectangularly shaped.

14. A differential amplifier circuit according to claim 12, wherein said first and second openings in said gate electrode layer are arranged in parallel with said third and fourth openings in said gate electrode layer.

* * * * *